(12) United States Patent
Shih et al.

(10) Patent No.: US 9,437,626 B2
(45) Date of Patent: Sep. 6, 2016

(54) MILLIMETRE WAVE INTEGRATED CIRCUITS WITH THIN FILM TRANSISTORS

(71) Applicants: Ishiang Shih, Brossard (CA); Cindy X. Qiu, Brossard (CA); Chunong Qiu, Brossard (CA); Yi-Chi Shih, Los Angeles (CA)

(72) Inventors: Ishiang Shih, Brossard (CA); Cindy X. Qiu, Brossard (CA); Chunong Qiu, Brossard (CA); Yi-Chi Shih, Los Angeles (CA)

( * ) Notice: Subject to any disclaimer, the term of this patent is extended or adjusted under 35 U.S.C. 154(b) by 0 days.

(21) Appl. No.: 14/756,093

(22) Filed: Aug. 3, 2015

(65) Prior Publication Data
US 2016/0005771 A1 Jan. 7, 2016

Related U.S. Application Data

(62) Division of application No. 13/987,832, filed on Sep. 9, 2013.

(51) Int. Cl.
| | | |
|---|---|---|
| H01L 27/13 | (2006.01) |
| H01L 21/84 | (2006.01) |
| H01L 27/12 | (2006.01) |
| H01L 29/423 | (2006.01) |
| H01L 21/02 | (2006.01) |
| H01L 21/4757 | (2006.01) |
| H01L 21/4763 | (2006.01) |
| H01L 49/02 | (2006.01) |
| H01L 29/24 | (2006.01) |
| H01L 29/66 | (2006.01) |

(52) U.S. Cl.
CPC ..... *H01L 27/1259* (2013.01); *H01L 21/02565* (2013.01); *H01L 21/47573* (2013.01); *H01L 21/47635* (2013.01); *H01L 27/124* (2013.01); *H01L 27/1218* (2013.01); *H01L 27/1225* (2013.01); *H01L 27/1255* (2013.01); *H01L 28/20* (2013.01); *H01L 28/40* (2013.01); *H01L 29/24* (2013.01); *H01L 29/42384* (2013.01); *H01L 29/66969* (2013.01)

(58) Field of Classification Search
CPC . H01L 27/13; H01L 21/84; H01L 29/66871; H01L 29/812; H01L 29/78633; H01L 29/7869; H01L 29/78648; H01L 29/78645; H03F 3/1935
USPC ......... 257/350, 280, E21.453, E29.317, 382, 257/E29.275, E29.282; 438/155
See application file for complete search history.

(56) References Cited

U.S. PATENT DOCUMENTS

| | | | | |
|---|---|---|---|---|
| 6,008,117 A * | 12/1999 | Hong | ................ | H01L 21/76826 257/E21.576 |
| 6,054,389 A * | 4/2000 | Cheng | ............... | H01L 21/76826 257/E21.589 |
| 2003/0178655 A1* | 9/2003 | Winslow | ........... | H01L 29/66871 257/280 |

* cited by examiner

*Primary Examiner* — David Vu
*Assistant Examiner* — Mouloucoulaye Inoussa

(57) ABSTRACT

MMIC circuits with thin film transistors are provided without the need of grinding and etching of the substrate after the fabrication of active and passive components. Furthermore, technology for active devices based on non-toxic compound semiconductors is provided. The success in the MMIC methods and structures without substrate grinding/etching and the use of semiconductors without toxic elements for active components will reduce manufacturing time, decrease economic cost and environmental burden. MMIC structures are provided where the requirements for die or chip attachment, alignment and wire bonding are eliminated completely or minimized. This will increase the reproducibility and reduce the manufacturing time for the MMIC circuits and modules.

8 Claims, 11 Drawing Sheets

MILLIMETRE WAVE INTEGRATED CIRCUITS WITH THIN FILM TRANSISTORS

CLAIM OF PRIORITY

This application is a divisional application of U.S. patent application Ser. No. 13/987,832, filed Sep. 9, 2013, entitled "Millimeter Wave Integrated Circuits with Thin Film Transistors" (currently pending), the entire disclosure of which is hereby incorporated herein by reference.

FIELD OF INVENTION

This invention relates to millimeter wave devices and circuits with thin film transistors. Specifically, it relates to thin film transistors with high charge carrier mobility and large breakdown electric field.

BACKGROUND OF THE INVENTION

MMICs are important components for communication systems. This is especially true for wireless systems. Each of the wireless systems requires a transmitting and receiving (T/R) module to send or to receive microwave signals. As shown in FIG. 1, a typical T/R module has a first input matching circuit, a power amplifier (PA) and a first output matching circuit, a switch (SW) and an antenna for transmitting operation. A second input matching circuit, a low noise amplifier (LNA) and a second output matching circuit together with the switch are used for receiving operation. Power supply to PA and LNA, operation conditions and control of PA and LNA are achieved by a bias and control logic (BCL) circuit. The bias and control logic (BCL) circuit is implemented normally by CMOS. PA, LNA and SW are implemented using III-V or SiGe technologies. The PA, LNA and SW are manufactured on a GaAs substrate which is subsequently grinded to a thickness suitable for heat dissipation and for transmission lines. After the grinding, the chips are usually bonded onto a carrier. On the carrier, there are metal patterns to accept bonding wires to complete the electrical connection between the chips. During the die attachment and wire bonding, special precautions are required to maintain the positions of chips and wires in order to maintain integrity of the circuits and to minimize interference. It is also important to keep the unwanted series resistance to be as small as possible so that unwanted heat generation can be minimized. During the die attachment, a layer of electrically and thermally conductive paste is applied between the carrier surface and the chip. Air bubbles or voids are frequently formed in the paste. These bubbles or voids can increase the thermal resistance between the chip and carrier, hence lead to non-uniformity in the heat dissipation of heat from the chip during the operation. Therefore, it would be advantageous to have a method and structure so that the active components and passive components are deposited directly on a substrate to form a module, hence to avoid the need of bonding a semiconductor chip to a carrier in order to form the module.

For modern MMICs in communications, majority of the chip area is for passive components or simply unused. For example, the area occupied by active components is only between 3%-5% in power amplifiers. An exemplary MMIC PA for transmitting as shown in FIG. 2 includes a switch, an input matching network, an amplifier, an output matching network and a bias-control circuit. Areas used by active components are indicated by dotted rectangle. To fabricate active components, epitaxial layers are required as the bases.

On the other hand, for passive components such as transmission lines, capacitors and inductors, the presence of epitaxial layers and the associated semiconductor substrate is not only not required but also sometimes detrimental. However, for the epitaxial wafers normally used for the manufacturing of MMICs, the entire surface is covered by uniform epitaxial layers which are deposited by MBE or MOCVD. In order to avoid performance degradation of the passive components, majority of the epitaxial layer which is not occupied by the active components are either removed or passivated by etching or ion implantation.

When monocrystalline GaAs substrates with epitaxial layers are used for MMICs fabrication, thickness of the substrate is usually 700 to 1000 μm, which is required to maintain integrity during handling and processing for MMICs. However, in order to reduce thermal resistance and to obtain standard 50 ohms transmission lines of reasonable line width, thickness of the GaAs substrates has to be reduced. Such thickness reduction is performed after all the active and passive components have been fabricated. Typical thickness values of the GaAs substrate after the reduction is 100 μm, 75 μm or even 50 μm. To reduce the thickness, the back surface of the substrate is first grinded to remove a major part of the substrate material. This is followed by a chemical etching process to increase the smoothness of the grinded back surface. It is thus clear that using GaAs substrate for MMIC fabrication, more than 80% of the starting GaAs substrate material must be removed. The grinding produces particles of GaAs still in compound semiconductor form and often mixed with water, whereas chemical etching produces ions and complexes of gallium and arsenic mixed in water. While ions and complexes of gallium are less harmful and are not considered as severe contaminants, ions and complexes of arsenic are highly toxic and are severe environment contaminants. In addition, the removal of GaAs particles and ions and complexes of gallium and arsenic requires filtering and ion exchanging. These methods are expensive and difficult to achieve using low cost equipment. Furthermore, after the grinding and etching for the back side of the GaAs substrate, via holes must be etched. The surfaces of these via holes must be plated with conductive metal layers in order to achieve grounding and improve thermal dissipation. For efficient transmission of microwaves, the thickness of substrate should be small enough to get 50 ohms microstrip. In addition, the heat generated by the components need to be remove from a heat sink connected to the back side of the substrate. The thickness of the substrate should be small in order to reduce the thermal resistance. After dicing, the chips are mounted on a carrier to complete the module.

In the prior art methods, as shown in FIG. 3, chips with different functions are selected and mounted on a carrier to form a module. The carrier is often a dielectric substrate with metal patterns on top. In addition, the carrier thickness should be small enough for efficient heat dissipation. In order to obtain functional module, the chips must be selected and precisely positioned or aligned on the dielectric carrier with respect to the metal transmission lines created on top of the dielectric carrier. Since the alignment and positioning is achieved by mechanical devices, high precision which is required for high reproducibility is difficult to achieve.

It is clear from the above comments that it is beneficial and desirable to develop MMIC circuits without the need of grinding and etching of the substrate after the fabrication of active and passive components. Furthermore, it is advantageous to develop technology for active devices without the need of compound semiconductors containing toxic elements such as GaAs or InGaAs. The success in the MMIC methods and structures without substrate grinding/etching and using semiconductors without toxic elements for active components will reduce manufacturing time and decrease economic cost and environmental burden. It is also beneficial to have an MMIC structure or method where the requirements for die or chip attachment, alignment and wire bonding are eliminated completely or minimized. This will increase the reproducibility and reduce the manufacturing time for the MMIC circuits and modules.

OBJECTIVES OF THE INVENTION

One objective of the invention is to provide MMIC circuits without the needs of grinding and etching of the substrate after active and passive component fabrication. Another objective of the invention is to provide technology for active devices in a MMIC without the need of compound semiconductors containing toxic elements such as GaAs or InGaAs. Yet another objective of the invention is to provide an MMIC structure for which the requirements for die or chip attachment, alignment and wire bonding are eliminated or minimized.

DETAILED DESCRIPTION OF THE PREFERRED EMBODIMENTS

1. Thin Film Transistor with a Flat Gate

Figure 1:
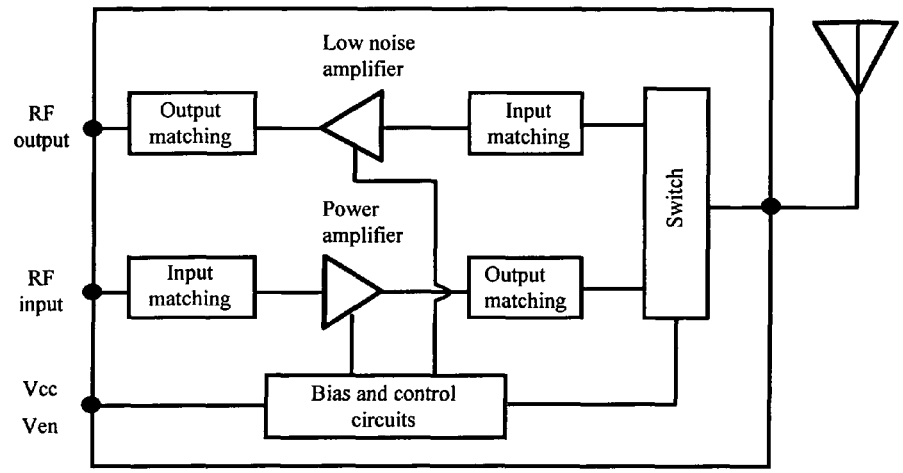
FIG. 1 shows a simplified block diagram of a transmit/receive (T/R) module.
Figure 2:
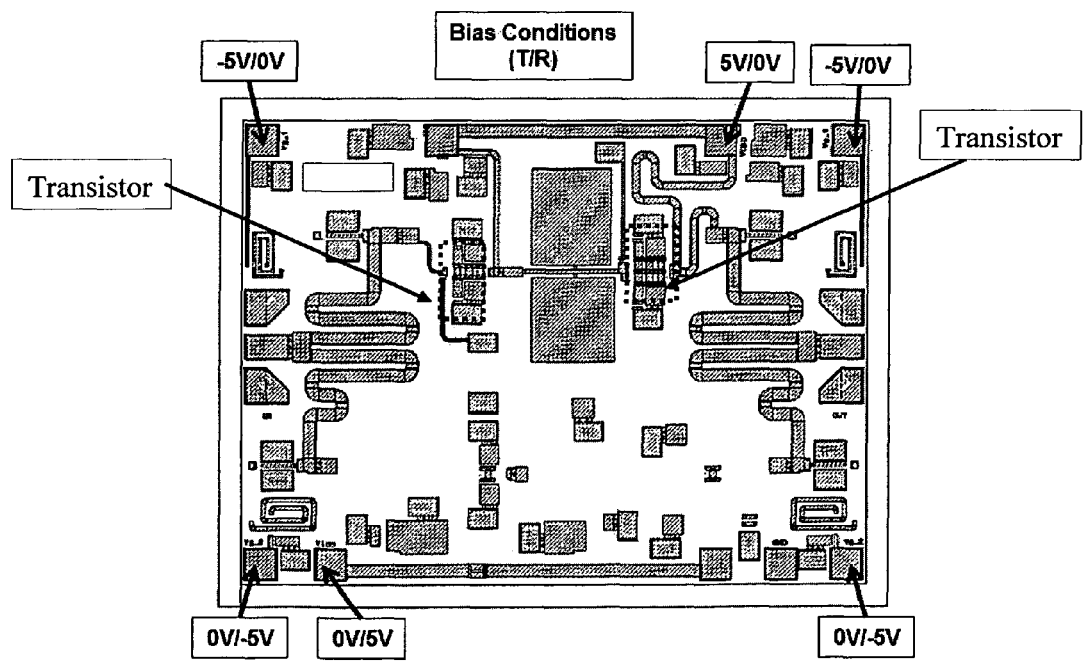
FIG. 2 A simplified layout of a two stage power amplifier on a GaAs substrate. The two dotted rectangles defined areas occupied by the active components. Areas outside the two dotted rectangles are used to build passive components such as transmission lines, bond pads, capacitors and inductors.
Figure 3:
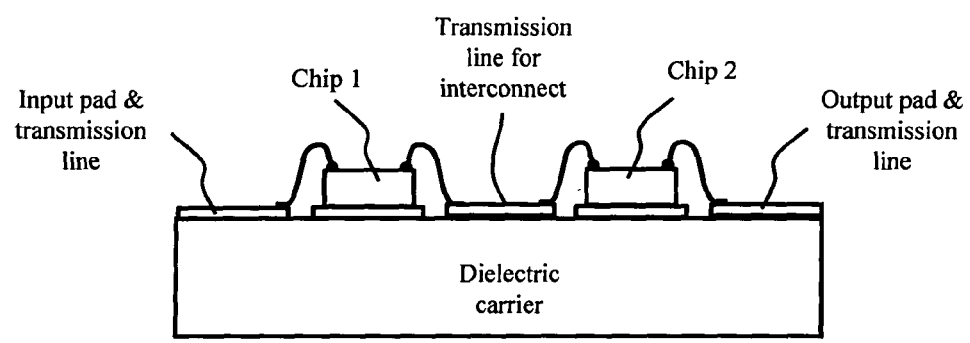
FIG. 3 A prior art MMIC chip mounted on a dielectric carrier for an MMIC module.
Figure 4:
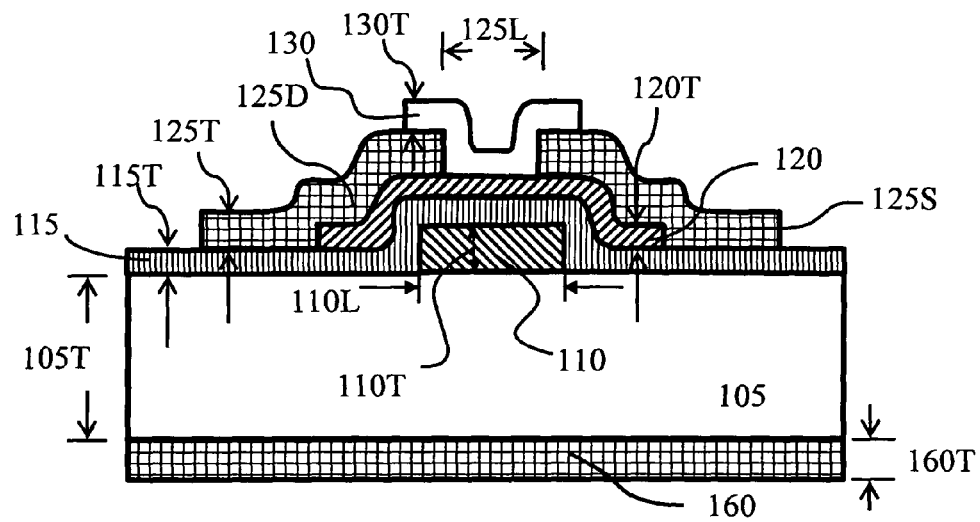
FIG. 4 shows a schematic cross-sectional view of a thin film transistor 100 on a dielectric substrate for microwave and millimeter wave integrated circuits.

According to the present invention, a thin film transistor (100, FIG. 4) for microwave and millimeter wave integrated circuits (MMICs), comprises a dielectric substrate (105) with a substrate thickness (105T); a first metal gate (110) having a first metal gate thickness (110T) and a first metal gate length (110L); a first dielectric layer (115) with a first dielectric layer thickness (115T); a first semiconductor channel layer (120) with a first semiconductor channel layer thickness (120T) overlapping first metal gate (110) of its entire length (110L); a drain (125D) and a source (125S) having a drain/source thickness of (125T) and a source drain gap (125L); and a second dielectric layer (130) having a second dielectric layer thickness (130T) for protection and passivation.

According to this invention, material for the semiconductor channel layer (120) is selected to have high carrier mobility and a large breakdown electric field whereas the first metal gate length (110L) is made to be small. The small first metal gate length (110L) and high carrier mobility of the channel layer (120) will allow the thin film transistor (100) to operate or switch at high frequencies, whereas the large breakdown electric field will allow operations at large output voltage. The first semiconductor channel layer thickness (120T) is selected to be in a range of 5 to 200 nm, so that effective modulation of charges in the first semiconductor channel layer (120) can be achieved. The first metal gate length (110L) is selected to be in a range of 300 to 2000 nm and the thickness (115T) of the first dielectric layer (115) is selected to be in a range of 20 to 200 nm. The dielectric substrate (105) is selected from a material group of alumina, silica glass and plastic. A back metal layer (160) is also deposited on the back side of the dielectric substrate (105), which allows grounding and chip attachment to a carrier to complete the electric circuits, to forms transmission lines and to reduces noises. In thin film transistor applications, a structure with two gate fingers is often used to increase breakdown voltage and to reduce the leakage. To simplify the descriptions, the thin film transistor (100) in the present invention is illustrated using a single gate finger structure. Therefore, it is understood that thin film transistors described in the present invention should not be limited to a single finger. A structure with two or more fingers may well be adopted in this invention.

The breakdown electric field of a semiconductor is determined by the energy bandgap value and the energy relaxation time, which is the mean time for electrons to interact with each other and with lattice vibration to lose the energy. When the mean time between interactions is short, the energy increase of an electron under the influence of an electric field will be small. When the total kinetic energy of the electron is substantially less than the energy band gap value, impact ionization will be negligible and the breakdown due to the application of electric field will not occur. Whereas, when two semiconductors have substantially same mean time for electron interactions but with different energy bandgap values, then the semiconductor with a larger energy band gap will be able to sustain a higher electric field before reaching breakdown compared to semiconductor with a smaller energy band gap. Devices or transistors fabricated using the semiconductor having a large breakdown electric field will be capable of operation at a higher output voltage as compared to transistors of comparable dimensions fabricated using the semiconductor with a low breakdown field. Therefore, to fabricate high power transistors, thin film semiconductors of large breakdown electric field are preferably used to achieve high power operation in this invention.

According to this invention, thin film transistors for high power MMIC applications are fabricated using semiconductors having breakdown electric field comparable to or substantially greater than the breakdown electric field of the well developed semiconductors Si and GaAs (0.3 and 0.4 MV/cm respectively). When properly selected and deposited, the breakdown electric field value can be several times of 0.4 MV/cm. This is believed to be the results of reduced energy relaxation times of charge carriers in certain compound semiconductors with large energy band gaps. According to this invention, those compound semiconductors are selected from a material group of: metal oxide, metal oxinitride and metal nitride, wherein said metal is selected from a material group including: indium (In), zinc (Zn), gallium (Ga), tin (Sn) and their alloys. Deposition of the metal oxide, metal oxinitride and metal nitride may be achieved by sputtering, reactive sputtering, ion sputtering, MOCVD and MBE.

In order to achieve the same unity current gain cut-off frequency in two field effect transistors fabricated using two different semiconductors of different carrier mobility, the channel length of the transistor made of the low carrier mobility semiconductor must be smaller than that of the transistor made of the high mobility semiconductor. Although the electron mobility in monocrystalline Si is high (1500 cm2/V-sec), the field effect mobility of the electrons in the inverted channel is much less, in the order of 500 cm2/V-sec. In order to operate the thin film transistor (100) at frequencies significantly greater than 1 GHz, the first metal gate length (110L) should be reduced to be less than 500 nm and preferably less than 250 nm especially when the carrier mobility in the first semiconductor channel layer (120) is not high enough so that the transit time from source (125S) to drain (125D) may be too long to limit the switch of the thin film transistor (100). However, when the first metal gate length (110L) is reduced to below 500 nm, the cross-sectional area of the gate metal is small so that series resistance associated with the metal gate in the direction perpendicular to the metal gate length direction is high. When the series resistance associated with the gate is high, the time required to charge or discharge parasitic capacitors between the first metal gate (110) and source (125S) and the capacitors between the metal gate (110) and the drain (125D) will be long. When this charging and discharging time exceeds the reciprocal of the operating frequency, sufficient carriers in the first semiconductor channel layer (120) will not be able to flow through the semiconductor channel to charge or discharge the parasitic capacitors and the gain of the transistor will decrease. Therefore, in order to ensure the performance of thin film MMICs, improvements must be made.

2. T-Gate Thin Film Transistor

According to an embodiment of this invention, a thin film transistor (200, FIG. 5) for microwave and millimeter wave integrated circuits is provided. It comprises a dielectric substrate (205) with a substrate thickness (205T); a first metal gate head portion (210) having a first metal gate head portion thickness (210T) and a first metal gate head portion length (210L); a first dielectric layer (215) with a first dielectric layer thickness (215T); a first metal gate stem portion (220) having a first metal gate stem portion thickness (220T) and a first metal gate stem portion length (220L), said first metal gate head portion and first metal gate stem portion are in direct contact with each other and they are embedded in said first dielectric layer (215). Thin film transistor (200) further comprises a second dielectric layer (225) having a second dielectric layer thickness (225T); a first semiconductor channel layer (230) with a first semiconductor channel layer thickness (230T) overlapping the entire first metal gate length; a drain (235D) and a source (235S) having a drain/source thickness (235T) and a source drain gap (235L); and a third dielectric layer (240) having a third dielectric layer thickness (240T) for protection and passivation. A back metal layer (245) is also deposited on the back side of the dielectric substrate (205) allowing grounding and chip attachment to a carrier, which complete the electric circuits, forms transmission lines and reduces noises.

According to this invention, material for the semiconductor channel layer (230) is selected to have high carrier mobility and large breakdown electric field whereas said first metal gate stem portion length (220L) is made to be small. The small first metal gate stem portion length and high carrier mobility will allow thin film transistor (200) to operate or switch at high frequencies, whereas the large breakdown electric field will allow operations at large output voltage.

The first semiconductor channel layer thickness (230T) is selected to be in a range of 5 to 200 nm, so that effective modulation of charges in the first semiconductor channel layer (230) can be achieved. The first metal gate stem portion length (220L) is selected to be in a range of 20 to 500 nm. Thickness of the second dielectric layer (225) is selected to be in a range of 20 to 200 nm. In thin film transistor applications, a structure with two gate fingers is often used to increase the breakdown voltage and to reduce the leakage. To simplify the description, the thin film transistor (200) in the present invention is illustrated using a single gate finger structure. Therefore, it is understood that thin film transistors described in the present invention should not be limited to a single finger. A structure with two or more fingers may well be adopted in this invention.

According to this invention, thin film transistors for high power MMIC applications are fabricated using semiconductors having breakdown electric field comparable to or substantially greater than the breakdown electric field of Si (0.3 MV/cm) and GaAs (0.4 MV/cm). When properly selected and deposited, the breakdown can be several times of 0.4 MV/cm. This is believed to be the results of reduced energy relaxation times of charge carriers in some compound semiconductors with large energy band gaps. According to this invention, those compound semiconductors are selected from a material group of: metal oxide, metal oxinitride and metal nitride, wherein said metal is selected from a material group including: In, Zn, Ga, Sn and their alloys. Deposition of the metal oxide, metal oxinitride and metal nitride may be achieved by sputtering, reactive sputtering, ion sputtering, MOCVD and MBE. In order to achieve the same unity current gain cut-off frequency in two field effect transistors fabricated using two different semiconductors of different carrier mobility, the channel length of the transistor made of the low carrier mobility semiconductor must be smaller than the channel length of the transistor made of the high mobility semiconductor.

3. T-Gate Thin Film Transistor with Ledges

For thin film transistor (200), the proximity of right-hand edge of the drain (235D) to left-hand edge of said first metal gate stem portion (220) may lead to excess leakage current or reduced breakdown voltage. In order to prevent this from happening, according to another embodiment of this invention, a thin film transistor with ledges (250, see FIG. 6) for microwave and millimeter wave integrated circuits is provided. It comprise a dielectric substrate (255) with a substrate thickness (255T); a first metal gate head portion (257) having a first metal gate head portion thickness (257T) and a first metal gate head portion length (257L); a first dielectric layer (260) with a first dielectric layer thickness (260T); a first metal gate stem portion (262) having a first metal gate stem portion thickness (262T) and a first metal gate tem portion length (262L), said first metal gate head portion and first metal gate stem portion are in direct electric contact with each other and they are embedded in the first dielectric layer (260). Thin film transistor (250) further comprises a second dielectric layer (265) having a second dielectric layer thickness (265T); a first semiconductor channel layer (267) having a first semiconductor channel layer thickness (267T) overlapping entire first metal gate length; a drain ledge layer (270D) and a source ledge layer (270S) having a ledge layer thickness (270T) and a ledge layer gap (270L), said drain ledge layer (270D) and said source ledge layer (270S) are in proximity to said first metal gate stem portion (262); a drain (272D) and a source (272S) having a drain/source thickness (272T) and a source drain gap (272L); and a third dielectric layer (275) having a third dielectric layer thickness (275T) for protection and passivation. A back metal layer (285) having a back metal thickness (285T) is also deposited on the back side of the dielectric substrate (255) for grounding and chip attachment to a carrier, which completes electric circuits, forms transmission lines and reduces noises.

According to this invention, material for the first semiconductor channel layer (267) is selected to have high carrier mobility and large breakdown electric field whereas said first metal gate stem portion length (262L) is made to be small. The small first metal gate stem portion length and high carrier mobility of the first semiconductor channel layer will allow the thin film transistor (250) to operate or switch high frequencies, whereas the large breakdown electric field will allow operations at large output voltage. The material of the first semiconductor channel layer (267) is selected from compound semiconductors group including: metal oxide, metal oxinitride and metal nitride, wherein said metal is selected from a material group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer (267) can be several times greater than that of GaAs (0.4 MV/cm).

Materials for the drain ledge layer (270D) and the source ledge layer (270S) are selected from a group of semiconductors including: metal oxide, metal oxinitride and metal nitride, where said metal is selected from a group of In, Zn, Ga, Sn and their alloys. Conductivity of the drain ledge layer and the source ledge layer is controlled to be substantially high through adjusting stoichiometry or by impurity doping. The drain ledge layer and source ledge layer reduce leakage current and increase the breakdown voltage between the first metal gate stem portion (262) and the first semiconductor channel layer (267).

The first semiconductor channel thickness (267T) is selected to be in a range of 5~200 nm, so that effective modulation of charges in the first semiconductor channel layer (267) can be achieved. The first metal gate stem portion length (262L) is selected to be in a range of 20 to 500 nm and the thickness of the second dielectric layer (265T) is selected to be 20~200 nm. The material of the dielectric substrate (255) is selected from a material group of alumina, silica glass and plastic.

In thin film transistor applications, a structure with two gate fingers is often used to increase the breakdown voltage and to reduce the leakage. To simplify the description, the thin film transistor (250) in the present invention is depicted using a single gate finger structure. Therefore, it is understood that thin film transistors described in the present invention should not be limited to a single finger. A structure with two or more fingers may well be adopted in this invention.

4. Planar Channel Thin Film Transistor

Figure 5:
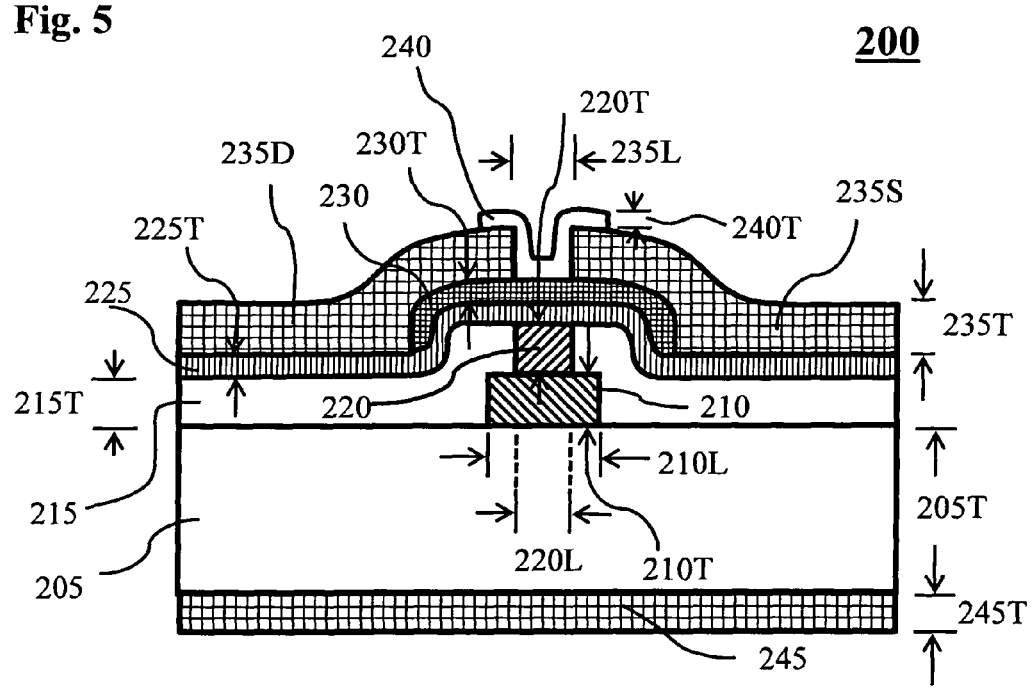
FIG. 5 shows a cross-sectional view of a thin film transistor 200 on a dielectric substrate, where an inverted metal T-gate is embedded in a first dielectric layer.
Figure 6:
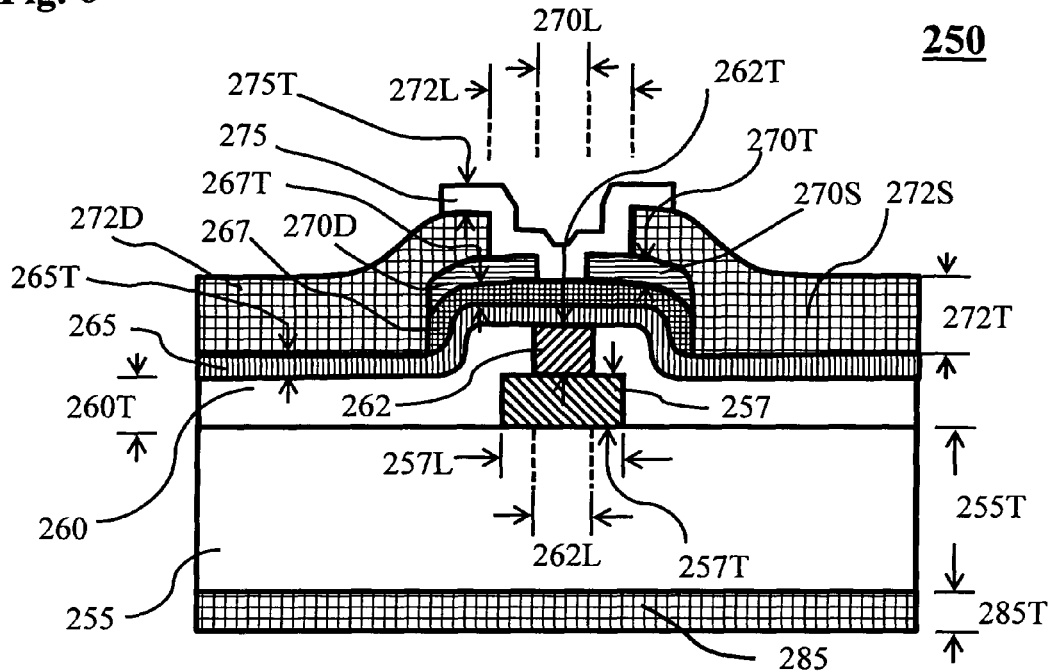
FIG. 6 is a cross-sectional view of a thin film transistor 250 with an inverted T-gate, where a drain ledge and a source ledge are provided to reduce leakage current and increase breakdown voltage.

For thin film transistors (200) and (250), shown in FIGS. 5 and 6, the presence of the first gate metal head portion (210 and 257) lead to protrusion of the cross-sections. Such protrusion makes the first semiconductor channel layer (230 and 267) to be substantially non-planar. This may have an effect on the propagation of microwaves, making the fabrication and uniformity of the first metal gate stem portion to be more difficult, and may lead to degradation of performance of the thin film transistors. Therefore, according to yet another embodiment of this invention, a thin film transistor with planar channel region (300, see FIG. 7) for microwave and millimeter wave integrated circuits is provided. It comprises a dielectric substrate (305) with a substrate thickness (305T); a first dielectric layer (315) having a first dielectric layer thickness (315T); a first metal gate head portion (310) having a first metal gate head portion thickness (310T) and a first metal gate head portion length (310L); a first metal gate stem portion (320) having a first metal gate stem portion thickness (320T) and a first metal gate stem portion length (320L). The first metal gate head portion (310) is embedded in the top surface region of the dielectric substrate (305) and the first metal gate stem portion (320) is embedded in the first dielectric layer (315). The first metal gate stem portion (320) is in direct electric contact with the first metal gate head portion (310), forming an inverted T-gate or Γ-gate embedded in the dielectric substrate (305) and the first dielectric layer (315). Thin film transistor (300) further comprises a second dielectric layer (325) having a second dielectric layer thickness (325T); a first semiconductor channel layer (330) having a first semiconductor channel layer thickness (330T); a drain (340D) and a source (340S) having a drain/source thickness of (340T) and a source drain gap (340L); and a third dielectric layer (345) having a third dielectric layer thickness (345T) for protection and passivation. A back metal layer (355) having a back metal layer thickness (355T) is also deposited on the back side of the dielectric substrate (305) allowing for grounding and chip attachment to a carrier, which completes electric circuits, forms transmission lines and reduces noises.

According to this invention, material of the first semiconductor channel layer (330) is selected to have high carrier mobility and large breakdown electric field whereas the first metal gate stem portion length (320L) is made to be small.

The small first metal gate stem portion length and high carrier mobility will allow thin film transistor (300) to operate or switch at high frequencies, whereas the large breakdown electric field will allow operations at large output voltages. The material of the first semiconductor channel layer (330) is selected from a compound semiconductor group including: metal oxide, metal oxinitride and metal nitride, wherein said metal is selected from a material group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer (330) can be several times of that of GaAs (0.4 MV/cm).

The first semiconductor channel layer thickness (330T) is selected to be in a range of 5 to 200 nm, so that effective modulation of charges in said first semiconductor channel layer can be achieved. The first metal gate stem portion length (320L) is selected to be in a range of 20~500 nm. The second dielectric layer thickness (325T) is selected to be 20 to 200 nm. The dielectric substrate (305) is selected from a material group of alumina, silica glass and plastic.

Formation of the inverted T-gate or Γ-gate structure which is embedded in the top surface region of the substrate (305) and first dielectric layer (315) may be achieved by performing a first selective etching of the dielectric substrate (305) to form a cavity; depositing a first metal layer and performing a first chemical and mechanical polishing for forming a head portion of a T-gate or Γ-gate; depositing a first dielectric layer to a first dielectric layer thickness; performing a second selective etching of the first dielectric layer; depositing a second metal layer and performing a second chemical and mechanical polishing for forming a stem portion of a T-gate or Γ-gate.

In thin film transistor applications, a structure with two gate fingers is often used to increase the breakdown voltage and to reduce the leakage. To simplify the descriptions, thin film transistor (300) in the present invention is illustrated using a single gate finger structure. Therefore, it is understood that thin film transistors described in the present invention should not be limited to a single finger. A structure with two or more fingers may well be adopted in this invention.

5. Planar Channel Thin Film Transistor with Ledges

Figure 7:
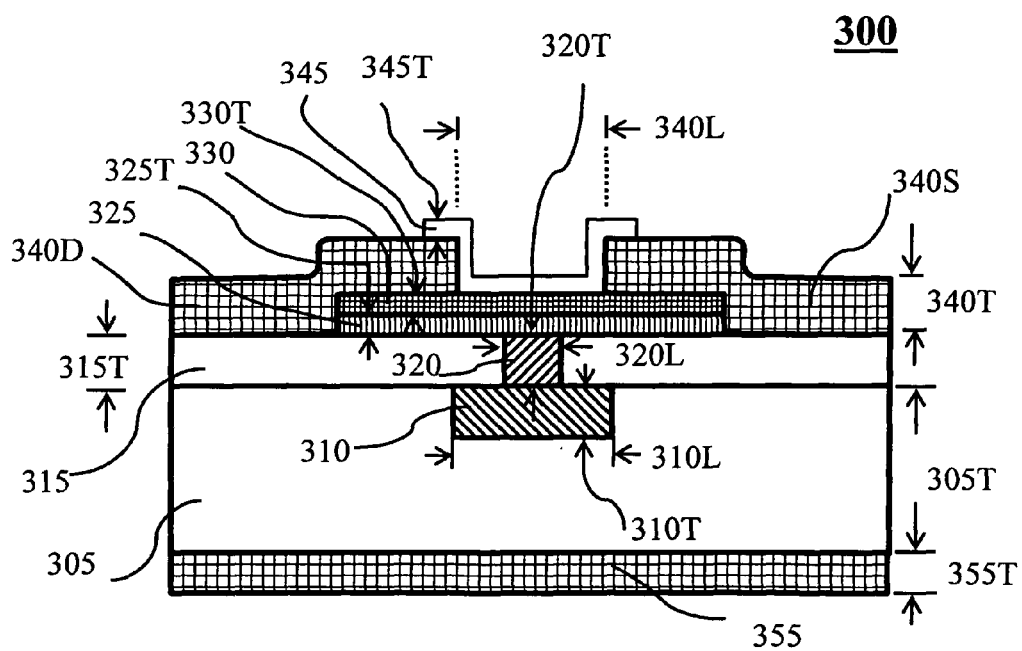
FIG. 7 is a cross-sectional view of a thin film transistor 300 with a planar semiconductor channel layer, where a head portion of an inverted metal T-gate is embedded in a dielectric substrate and a stem portion of the inverted T-gate is embedded in a first dielectric layer.

For thin film transistor with a planar channel structure (300) in FIG. 7, the series resistance of the first semiconductor channel layer (330) may be too high, even though the surface supporting the first semiconductor channel layer has been flattened. In order to reduce unwanted drain-source series resistance and not to increase gate-channel leakage and breakdown, according to still another embodiment of this invention, a thin film transistor with planar channel layer and ledges (400, see FIG. 8) for microwave and millimeter wave integrated circuits is provided. Thin film transistor (400) comprises a dielectric substrate (405) with a dielectric substrate thickness (405T); a first dielectric layer (415) having a first dielectric layer thickness (415T); a first metal gate head portion (410) having a first metal gate head portion thickness (410T) and a first metal gate head portion length (410L); and a first metal gate stem portion (420) having a first metal gate stem portion thickness (420T) and a first metal gate stem portion length (420L). The first metal gate head portion (410) is embedded in top surface region of the substrate (405) and the first metal gate stem portion (420) is embedded in the first dielectric layer (415) and is in direct electric contact with the first metal gate head portion (410), forming an inverted T-gate or Γ-gate embedded in the substrate (405) and the first dielectric layer (415). Thin film transistor (400) further comprises a second dielectric layer (425) having a second dielectric layer thickness (425T); a first semiconductor channel layer (430) having a first semiconductor channel layer thickness (430T); a drain ledge layer (435D) and a source ledge layer (435S) having a ledge layer thickness (435T) and a ledge layer gap (435L) wherein the drain ledge layer (435D) and the source ledge layer (435S) are in proximity to the first metal gate stem portion (420); a drain (440D) and a source (440S) having a drain/source thickness of (440T) and a source drain gap (440L); and a third dielectric layer (445) having a third dielectric layer thickness (445T) for protection and passivation. A back metal layer (465) having a thickness (465T) is also deposited on the back side of the dielectric substrate (405), allowing for grounding and chip attachment to a carrier to complete electric circuits, form transmission lines and reduce noises.

According to this invention, material for the first semiconductor channel layer (430) is selected to have high charge carrier mobility and large breakdown electric field whereas the first metal gate stem portion length (420L) is made to be small. The small first metal gate stem portion length and high carrier mobility will allow the thin film transistor (400) to operate or switch at high frequencies, whereas the large breakdown electric field will allow operations at large output voltage. The material of the first semiconductor channel layer (430) is selected from a compound semiconductor group including: metal oxide, metal oxinitride and metal nitride, wherein said metal is selected from a material group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer (430) can be several times greater than that of GaAs (0.4 MV/cm).

The materials for the drain ledge layer (435D) and the source ledge layer (435S) are selected from a group of compound semiconductors including: metal oxide, metal oxide nitride and metal nitride, where said metal is selected from a material group of In, Zn, Ga, Sn and their alloys. Conductivity of the drain ledge layer and source ledge layer is controlled to be substantially high through adjusting stoichiometry or by impurity doping. The drain ledge layer and source ledge layer reduce leakage current and increase the breakdown voltage between the first metal gate stem portion (420) and the first semiconductor channel layer (430).

The first semiconductor channel thickness (430T) is selected to be in a range of 5 to 200 nm, so that effective modulation of charges in the first semiconductor channel layer can be achieved. The first metal gate stem portion length (420L) is selected to be in a range of 20 to 500 nm. Thickness of the second dielectric layer (425) is selected to be in a range of 20 to 200 nm. The dielectric substrate (405) is selected from a material group of alumina, silica glass and plastic.

Formation of the inverted T-gate or Γ-gate structure which is embedded in the top surface region of the substrate (405) and first dielectric layer (415) may be achieved by performing a first selective etching of the dielectric substrate (405) to form a cavity; depositing a first metal layer and performing a first chemical and mechanical polishing for forming a head portion of a T-gate or Γ-gate; depositing a first dielectric layer to a first dielectric layer thickness; performing a second selective etching of the first dielectric layer; depositing a second metal layer and performing a second chemical and mechanical polishing for forming a stem portion of a T-gate or Γ-gate.

In thin film transistor applications, a structure with two gate fingers is often used to increase the breakdown voltage and to reduce the leakage. To simplify the description, the thin film transistor (400) in the present invention is depicted using a single gate finger structure. Therefore, it is understood that thin film transistors described in the present invention should not be limited to a single finger. A structure with two or more fingers may well be adopted in this invention.

6. Planar Channel Thin Film Transistor

Figure 8:
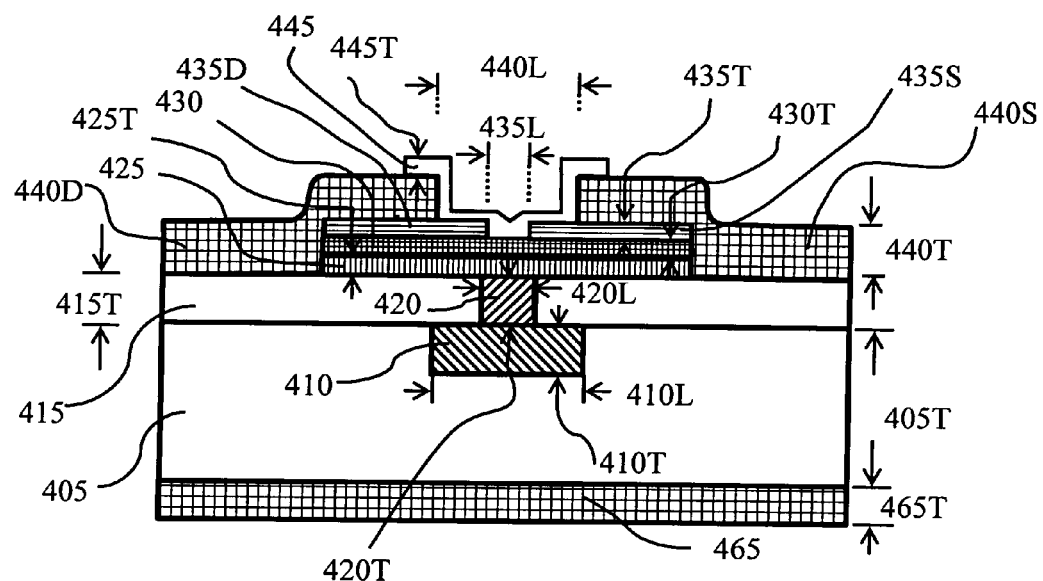
FIG. 8 shows a thin film transistor 400 with a planar semiconductor channel, where a drain ledge and a source ledge are provided to reduce leakage current and increase breakdown voltage.

In thin film transistors with planar channel layer structure (300, 400) shown in FIGS. 7 and 8, the first metal gate head portion (310, 410) is embedded in the dielectric substrate (305, 405). To facilitate the processing and to improve performance of the MMICs, according to one other embodiment of this invention, a thin film transistor with planar channel layer (500, see FIG. 9) for microwave and millimeter wave integrated circuits is provided. It comprises a dielectric substrate (505) with a substrate thickness (505T); a first dielectric layer (507) having a first dielectric layer thickness (507T); a second dielectric layer (515) having a second dielectric layer thickness (515T); a first metal gate head portion (510) having a first metal gate head portion thickness (510T) and a first metal gate head portion length (510L); a first metal gate stem portion (520) having a first metal gate stem portion thickness (520T) and a first metal gate stem portion length (520L). The first metal gate head portion (510) is embedded in the first dielectric layer (507) and the first metal gate stem portion (520) is embedded in the second dielectric layer (515). The first metal gate stem portion (520) is in direct electric contact with the first metal gate head portion (510), forming an inverted T-gate or Γ-gate embedded in the first dielectric layer (507) and the second dielectric layer (515). Thin film transistor (500) further comprises a third dielectric layer (525) having a third dielectric layer thickness (525T); a first semiconductor channel layer (530) having a first semiconductor channel layer thickness (530T); a drain (540D) and a source (540S) having a drain/source thickness of (540T) and a source drain gap (540L); and a fourth dielectric layer (545) having a fourth dielectric layer thickness (545T) for protection and passivation. A back metal layer (555) having a thickness (555T) is also deposited on the back side of the dielectric substrate (505), allowing for grounding and chip attachment to a carrier to complete electric circuits, form transmission lines and reduce noises.

According to this invention, material for the semiconductor channel layer (530) is selected to have high carrier mobility and large breakdown electric field whereas said first metal gate length is made to be small. The small first metal gate length and high charge carrier mobility will allow thin film transistor (500) to operate or switch at high frequencies, whereas the large breakdown electric field will allow operations at large output voltage. The material of the first semiconductor channel layer (530) is selected from a compound semiconductor group including: metal oxide, metal oxinitride and metal nitride, wherein said metal is selected from a material group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer (530) can be several times that of GaAs (0.4 MV/cm).

The first semiconductor channel thickness (530T) is selected to be in a range of 5 to 200 nm, so that effective modulation of charges in the first semiconductor channel layer can be achieved. The first metal gate stem portion length (520L) is selected to be in a range of 20 to 500 nm. Thickness of the third dielectric layer (525) is selected to be in a range of 20 to 200 nm. The dielectric substrate (505) is selected from a material group of alumina, silica glass and plastic.

Figure 9:
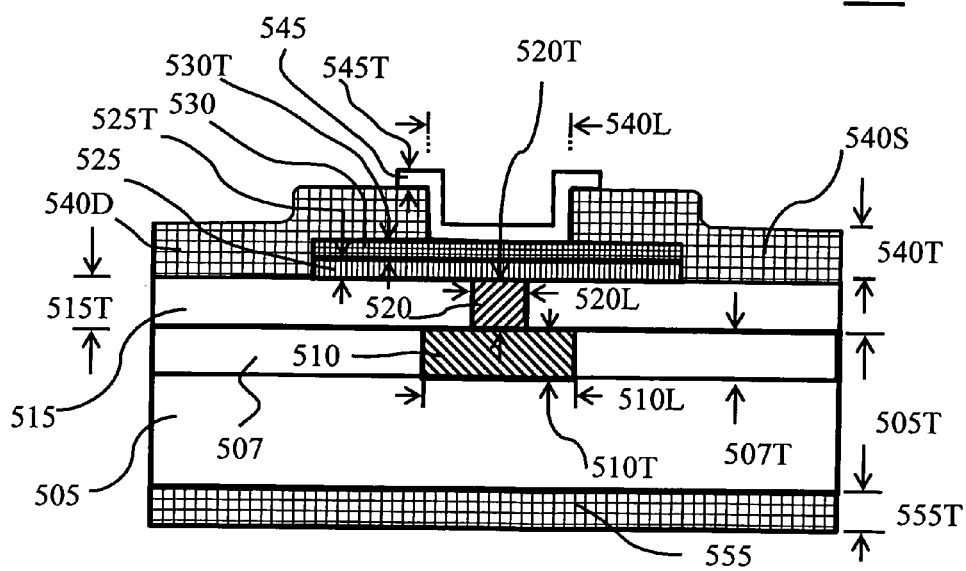
FIG. 9 shows a thin film transistor 500 with a planar semiconductor channel layer, where a head portion of an inverted metal T-gate is embedded in a first dielectric layer and a stem portion of the inverted T-gate is embedded in a second dielectric layer.

Formation of the inverted T-gate or Γ-gate structure shown in FIG. 9, which is embedded in first dielectric layer (507) and the second dielectric layer (515) may be achieved by depositing a first dielectric layer to a first dielectric layer thickness; performing a selective etching of the first dielectric layer; depositing first metal layer and performing a first chemical and mechanical polishing for forming a head portion of the T-gate or Γ-gate; depositing a second dielectric layer to a second dielectric layer thickness; performing a selective etching of the second dielectric layer; depositing a second metal layer and performing a second chemical and mechanical polishing for forming a stem portion of the T-gate or Γ-gate.

In thin film transistor applications, it is understood that a structure with two gate fingers are often used in order to increase the breakdown voltage and to reduce the leakage. To simplify the description, the thin film transistor in the present invention is described using a single gate finger structure. Therefore, it is understood that thin film transistor (500) illustrated in the present invention should not be limited to a single finger. A structure with two or even more fingers may well be adopted in this invention.

7. Planar Thin Film Transistor with Ledges

For the thin film transistor with planar channel layer and T-gate structure (500, in FIG. 9), a large leakage current between the first metal gate and the first semiconductor channel layer may exist. To minimize the unwanted leakage and reduced breakdown voltage between the first metal gate and said first semiconductor channel layer to improve the performance of the MMICs, according to yet another embodiment of this invention, a thin film transistor with planar channel layer and ledges (600, see FIG. 10) for microwave and millimeter wave integrated circuits is provided. It comprises a dielectric substrate (605) with a substrate thickness (605T); a first dielectric layer (607) having a first dielectric layer thickness (607T); a second dielectric layer (615) having a second dielectric layer thickness (615T); a first metal gate head portion (610) having a first metal gate head portion thickness (610T) and a first metal gate head portion length (610L); a first metal gate stem portion (620) having a first metal gate stem portion thickness (620T) and a first metal gate stem portion length (620L). The first metal gate head portion (610) is embedded in the first dielectric layer (607) and the first metal gate stem portion (620) is embedded in the second dielectric layer (615). The first metal gate stem portion (620) is in direct electric contact with the first metal gate head portion (610), forming an inverted T-gate or Γ-gate embedded in the first dielectric layer (607) and the second dielectric layer (615). The thin film transistor also comprises a third dielectric layer (625) having a third dielectric layer thickness (625T); a first semiconductor channel layer (630) having a first semiconductor channel layer thickness (630T); a drain ledge layer (635D) and a source ledge layer (635S) having a ledge layer thickness (635T) and a ledge layer gap (635L) where the drain ledge layer and the source ledge layer are in proximity to the first metal gate stem portion (620); a drain (640D) and a source (640S) having a drain/source thickness of (640T) and a source drain gap (640L); and a fourth dielectric layer (645) having a fourth dielectric layer thickness (645T) for protection and passivation. A back metal layer (655) having a thickness (655T) is also deposited on the back side of the dielectric substrate (605), allowing for grounding and chip attachment to a carrier to complete electric circuits, form transmission lines and reduce noises.

According to this invention, material for the semiconductor channel layer (630) is selected to have high carrier mobility and large breakdown electric field whereas the first metal gate length is made to be small. The small first metal gate length and high carrier mobility will allow thin film transistor (600) to operate or switch at high frequencies, whereas the large breakdown electric field will allow operations at large output voltage. The material of the first semiconductor channel layer (630) is selected from a compound semiconductor group including: metal oxide, metal oxinitride and metal nitride, wherein said metal is selected from a material group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer (630) can be several times greater than that of GaAs (0.4 MV/cm).

The first semiconductor channel thickness (630T) is selected to be in a range of 5 to 200 nm, so that effective modulation of charges in the first semiconductor channel layer can be achieved. The first metal gate stem portion length (520L) is selected to be in a range of 20 to 500 nm. Thickness of the third dielectric layer (625) is selected to be in a range of 20 to 200 nm. The dielectric substrate (605) is selected from a material group of alumina, silica glass and plastic.

The materials for the drain ledge layer (635D) and the source ledge layer (635S) are selected from a group of compound semiconductors including: metal oxide, metal oxide nitride and metal nitride, wherein said metal is selected from a material group of In, Zn, Ga, Sn and their alloys. Conductivity of the drain ledge layer and source ledge layer is controlled to be substantially high through adjusting stoichiometry or by impurity doping. The drain ledge layer and source ledge layer reduce leakage current and increase the breakdown voltage between the first metal gate stem portion (620) and the first semiconductor channel layer (630).

Figure 10:
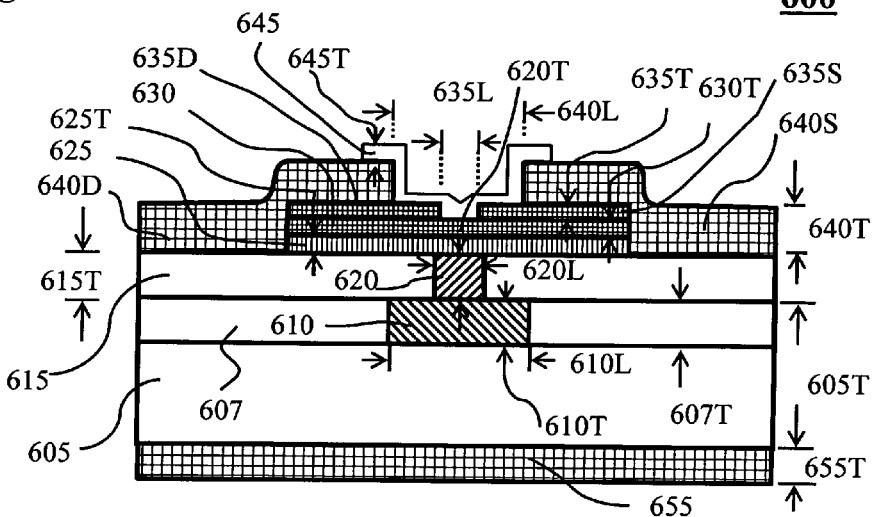
FIG. 10 shows a thin film transistor 600 with a planar semiconductor channel layer, where an inverted T-gate is embedded in a first dielectric layer and a second dielectric layer. A drain ledge and a source ledge are provided to reduce leakage current and to increase breakdown voltage.

Formation of the inverted T-gate or Γ-gate structure shown in FIG. 10, which is embedded in the first dielectric layer (607) and the second dielectric layer (615) may be achieved by depositing a first dielectric layer to a first dielectric layer thickness; performing a selective etching of the first dielectric layer; depositing first metal layer and performing a first chemical and mechanical polishing for forming a head portion of the T-gate or Γ-gate; depositing a second dielectric layer to a second dielectric layer thickness; performing a selective etching of the second dielectric layer; depositing a second metal layer and performing a second chemical and mechanical polishing for forming a stem portion of the T-gate or Γ-gate.

In thin film transistor applications, it is understood that a structure with two gate fingers are often used in order to increase the breakdown voltage and to reduce the leakage. To simplify the description, the thin film transistor (600) in the present invention is illustrated using a single gate finger structure. Therefore, it is understood that thin film transistors described in the present invention should not be limited to a single finger. A structure with two or even more fingers may well be adopted in this invention.

8. A Simplified MMIC with Thin Film Transistor of a Planar Channel and an Inverted T-Gate To simplify the description of one embodiment of this invention, a simplified MMIC (700) is described. For an MMIC to yield the required functions, it needs to have many more components beside the ones described below. For example, more than one transistor, resistors, capacitors and even inductors are commonly incorporated with transmission lines and diodes in a practical MMIC. Therefore, the MMIC (700) described below is used only to describe the distinctive features of this invention and should not be considered as limitation to the invention.

To form an MMIC, passive components are preferably integrated in the same structure of the active components. According to one embodiment of this invention, an MMIC (700, see FIG. 11) including a thin film transistor (700TR) having a planar channel layer, a capacitor (700C) and a thin film resistor (700R) for microwave and millimeter wave conditioning and amplification is provided. The MMIC (700) comprises a dielectric substrate (705) with a substrate thickness (705T); a first dielectric layer (710) having a first dielectric layer thickness (710T); a first metal gate head portion (715) having a first metal gate head portion thickness (715T) and a first metal gate head portion length (715L); a second dielectric layer (718) with a second dielectric layer thickness (718T); a first metal gate stem portion (720) having a first metal gate tem portion length (720L) and a first metal gate stem portion thickness (720T) which is the same as the second dielectric layer thickness (718T). The first metal gate head portion (715) is embedded in the first dielectric layer (710) whereas the first metal gate stem portion (720) is embedded in the second dielectric layer (718). The first metal gate stem portion (720) is in direct electric contact with the first metal gate head portion (715), forming a planar inverted T-gate or Γ-gate embedded in the first dielectric layer and the second dielectric layer. MMIC (700) also comprises a third dielectric layer (725) having a third dielectric layer thickness (725T); a first semiconductor channel layer (730) having a first semiconductor channel layer thickness (730T); a drain ledge layer (735D) and a source ledge layer (735S) having a ledge layer thickness (735T) and a ledge layer gap (735L) wherein the drain ledge layer and source ledge layer are in proximity to the first metal gate stem portion (720); a drain (740D) and a source (740S) having a drain/source thickness (740T) and a drain source gap (740L); and a fourth dielectric layer (745) having a fourth dielectric layer thickness (745T) for protection and passivation.

MMIC (700) further comprises a first capacitor electrode (716) for capacitor (700C) having a first capacitor electrode length (716L) and a first capacitor electrode thickness (716T); a second capacitor electrode (717) which overlaps at least a portion of the first capacitor electrode (716), capacitance of the capacitor (700C) being defined by overlapping area of the first capacitor electrode and the second capacitor electrode, second dielectric layer thickness (718T) and dielectric constant of the second dielectric layer. MMIC (700) furthermore comprises a first thin film resistor layer (750) having a first thin film resistor thickness (750T); a first resistor contact (760A) and a second resistor contact (760B) having a resistor contact thickness (760T), separation between (760A) and (760B) defines a thin film resistor length (750L). Sheet resistance of the thin film resistor layer (750) is regulated through controlling resistivity of the first thin film resistor layer (750) and the first thin film resistor thickness (750T). Finally, a resistor dielectric layer (765) for thin film resistor (700R) with a resistor dielectric layer thickness (765T) is deposited for passivation and protection of the thin film resistor (700R). A back metal layer (770) with a back metal layer thickness (770T) is deposited on the back side of the dielectric substrate (705) to allow for grounding and chip attachment to a carrier, to form transmission lines and to reduce noises.

The first semiconductor channel layer thickness (730T) is selected to be in a range of 5 to 200 nm, so that effective modulation of charges in the first semiconductor channel layer can be achieved. The first metal gate stem portion length (720L) is selected to be in a range of 20 to 500 nm and the third dielectric layer thickness (725T) is selected in a range of 20 to 200 nm.

Materials for the first dielectric layer (710), second dielectric layer (718), third dielectric layer (725), fourth dielectric layer (745) and resistor dielectric layer (765) may be selected from a material group of silicon oxide, silicon oxinitride, silicon nitride, hafnium oxide, aluminum oxide or their mixtures. Whereas material for the first thin film resistor layer (750) may be selected from material group of tantalum oxide and nickel-chromium alloy. The dielectric substrate (705) is selected from a material group of alumina, silica glass and plastic.

According to this invention, thin film transistors for high power MMIC applications are fabricated using semiconductors having high carrier mobility and large breakdown electric field whereas the first metal gate length is made to be small. The small first metal gate length and high carrier mobility will allow thin film transistor to operate or switch at high frequencies, whereas the large breakdown electric field will allow operations at large output voltage. The material of the first semiconductor channel layer (730) is selected from a compound semiconductor group including: metal oxide, metal oxinitride and metal nitride, wherein said metal is selected from a group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer can be several times of 0.4 MV/cm.

The drain ledge layer (735D) and source ledge layer (735S) are made of materials selected from a group of compound semiconductors including: metal oxide, metal oxide nitride and metal nitride wherein said metal is selected from a group including In, Zn, Ga, Sn and their alloys. Conductivity of the drain ledge layer and source ledge layer is controlled to be substantially high through adjusting stoichiometry or by impurity doping. The drain ledge layer and source ledge layer reduce leakage current and increase the breakdown voltage between the first metal gate stem portion and the first semiconductor channel layer.

In thin film transistor applications, it is understood that a structure with two gate fingers are often used in order to increase the breakdown voltage and to reduce the leakage. To simplify the description, the thin film transistor (700TR) is illustrated using a single gate finger structure. Therefore, it is understood that thin film transistors provided in the present invention should not be limited to a single finger. A structure with two or even more fingers may well be adopted in this invention.

Formation of the inverted T-gate or Γ-gate structure which is embedded in the first dielectric layer (710) and the second dielectric layer (718) may be achieved by depositing a first dielectric layer (710) to a first dielectric layer thickness (710T); performing a selective etching of the first dielectric layer; depositing a first metal layer and performing a first chemical and mechanical polishing for forming a head portion of the T-gate or Γ-gate; depositing a second dielectric layer; performing a selective etching of the second dielectric layer; depositing a second metal layer and carrying out a second chemical and mechanical polishing for forming a stem portion of the T-gate or Γ-gate.

9. A Simplified MMIC with Top Gate Thin Film Transistor

To simplify the description of one embodiment of this invention, a simplified MMIC (800) is depicted below to show the distinctive features. For an MMIC to yield the required functions, it needs to have many more components than the one described below. For example, more than one transistor, resistors, capacitors and even inductors are commonly incorporated with transmission lines and diodes in a practical MMIC. Therefore, the MMIC (800) described below is used only to describe the distinctive features of this invention and should not be considered as limitation to the invention.

Figure 12:
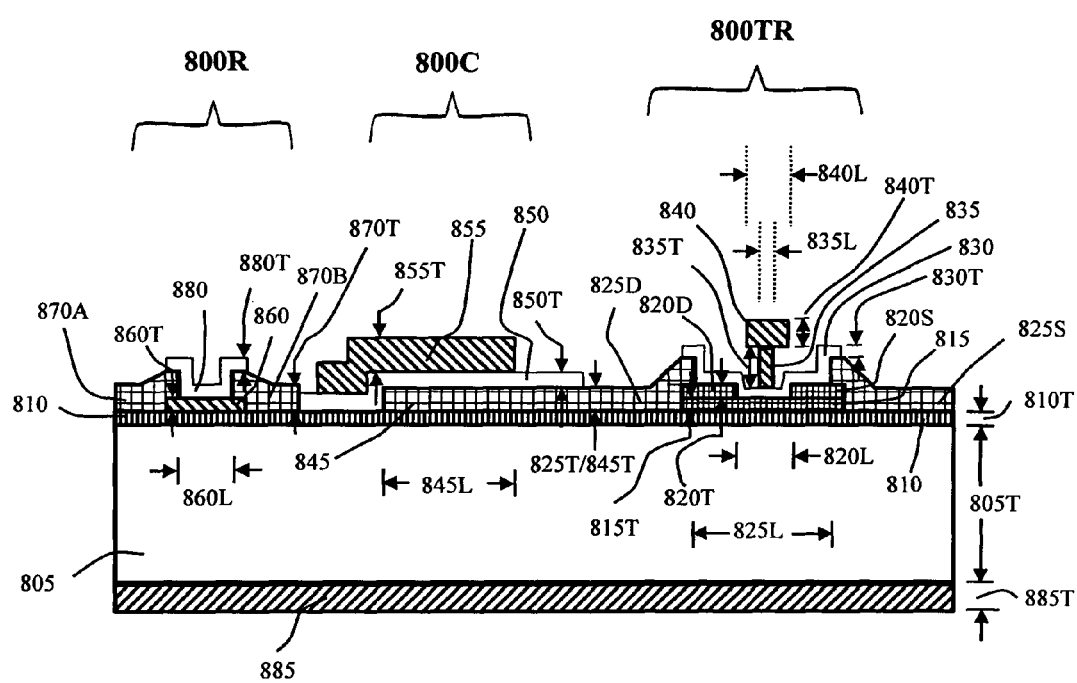
FIG. 12 shows a simplified MMIC 800 with a thin film transistor 800TR, a thin film resistor 800R and a thin film capacitor 800C, where the thin film transistor 800TR has a planar semiconductor channel layer, a drain ledge, a source ledge and a top gate structure.

According to one embodiment of the present invention, an MMIC (800) having a thin film transistor with a surface T-gate or Γ-gate (800TR), a capacitor (800C) and a thin film resistor (800R) for microwave and millimeter wave conditioning and amplification is provided in FIG. 12. MMIC (800) comprises a dielectric substrate (805) with a substrate thickness (805T); a first dielectric layer (810) having a first dielectric layer thickness (810T) forming a passivation layer for the dielectric substrate; a first semiconductor channel layer (815) having a first semiconductor channel layer thickness (815T); a drain ledge layer (820D) and a source ledge layer (820S) having a ledge layer thickness (820T) and a ledge layer gap (820L); a drain (825D) and a source (825S) having a drain/source thickness of (825T) and a source drain gap (825L); a second dielectric layer (830) having a second dielectric layer thickness (830T); a first metal gate stem portion (835) having a first metal gate stem portion thickness (835T) and a first metal gate stem portion length (835L); a first metal gate head portion (840) having a first metal gate head portion thickness (840T) and a first metal gate head portion length (840L), said first metal gate stem portion (835) and first metal gate head portion (840) form a first metal T-gate or Γ-gate for the thin film transistor (800TR).

The capacitor (800C) comprises a first capacitor electrode (845) having a first capacitor electrode length (845L) and a first capacitor electrode thickness (845T, the same as 825T); a capacitor dielectric layer (850) with a capacitor dielectric layer thickness (850T); a second capacitor electrode (855) having a second capacitor electrode thickness (855T) which overlaps at least a portion of the first capacitor electrode (845). Capacitance of said capacitor (800C) is defined by overlapping area of the first capacitor electrode (845) and the second capacitor electrode (855), capacitor dielectric layer thickness (850T) and dielectric constant of the capacitor dielectric layer (850). Thin film resistor (800R) comprises a first thin film resistor layer (860) having a first thin film resistor layer thickness (860T); a first resistor contact (870A) and a second resistor contact (870B), the gap between the first resistor contact and the second resistor contact defining a thin film resistor length (860L); a resistor dielectric layer (880) with a resistor dielectric layer thickness (880T) for passivation and protection of the thin film resistor. Sheet resistance of the thin film resistor layer (860) is regulated by controlling resistivity of the first thin film resistor layer and the first thin film resistor layer thickness (860T). Finally, a back side metal layer (885) with a back side metal layer thickness (885T) is deposited on the back of the dielectric substrate (805) to allow for grounding and chip attachment to a carrier, to form transmission lines and to reduce noises. In FIG. 12, the first capacitor electrode (845) and the drain (825D) are connected and are formed at the same time. However, they can also be disconnected and formed at different times.

The first semiconductor channel layer thickness (815T) is selected to be in a range of 5 to 200 nm so that effective modulation of charges in the first semiconductor channel layer can be achieved. The first metal gate stem portion length (835L) is selected to be in a range of 20 to 500 nm. Thickness of the second dielectric layer (830T) is selected to be in a range of 20 to 200 nm.

Materials for the first dielectric layer (810), second dielectric layer (830), capacitor dielectric layer (850), and resistor dielectric layer (880) may be selected from a material group of silicon oxide, silicon oxinitride, silicon nitride, hafnium oxide, aluminum oxide or their mixtures. Whereas material for the first thin film resistor layer (860) may be selected from material group of tantalum oxide and nickel-chromium alloy. The dielectric substrate (805) is selected from a material group containing alumina, silica glass and plastic.

According to this invention, thin film transistors for high power MMIC applications are fabricated using semiconductors having high carrier mobility and large breakdown electric field whereas the first metal gate length is made to be small to allow thin film transistor to operate or switch at high frequencies and at large output voltages. The material of the first semiconductor channel layer (815) is selected from a compound semiconductor group including: metal oxide, metal oxinitride and metal nitride, wherein said metal is selected from a group including: In, Zn, Ga, Sn and their alloys. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer can be several times of 0.4 MV/cm.

The drain ledge layer (820D) and source ledge layer (820S) are made of materials selected from a group of compound semiconductors including metal oxide, metal oxide nitride and metal nitride, wherein said metal is selected from a material group of In, Zn, Ga, Sn and their alloys. Conductivity of the drain ledge layer and source ledge layer is controlled to be substantially high through adjusting stoichiometry or by impurity doping. The drain ledge layer and source ledge layer reduce leakage current and increase breakdown voltage between the first metal gate stem portion (835) and the first semiconductor channel layer (815).

A top T-gate or Γ-gate structure may be formed by creating a sacrificial mould first and followed by deposition and formation of a first metal gate stem portion and a first metal gate head portion. The first layer of the first metal gate stem portion may be selected to have a work function suitable to form a Schottky contact with the first semiconductor channel layer.

In thin film transistor applications, it is understood that a structure with two gate fingers are often in order to increase the breakdown voltage and to reduce the leakage. To simplify the description, thin film transistor (800TR) is depicted using a single gate finger structure. Therefore, it is understood that thin film transistors described in the present invention should not be limited to a single finger. A structure with two or more fingers may well be adopted in this invention.

10. Fabrication Steps for Bottom T-Gate MMICs

Figure 11:
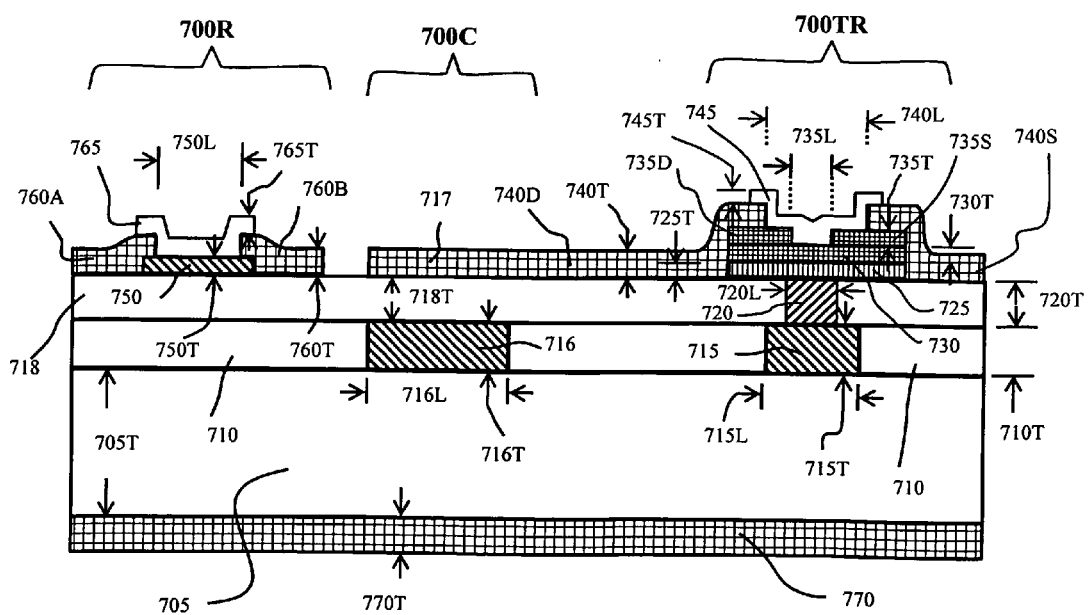
FIG. 11 shows a simplified MMIC 700 with a thin film transistor 700TR, a thin film resistor 700R and a thin film capacitor 700C, where the thin film transistor 700TR has a planar semiconductor channel layer, an inverted T-gate, a drain ledge and a source ledge for microwave and millimeter wave conditioning and amplification.

An example of fabrication of thin film transistor and passive components for an MMIC is given below. To simplify the description, the example will include only one thin film transistor, one thin film capacitor and one thin film resistor. It is understood that more components either active or passive can be included. In addition, inductors, transmission lines interconnect and bond pads and other components which may be required for the MMICs are not included in this example for simplification purposes. As an example to provide essential steps for the fabrication of a MMIC, the simplified structure (700) depicted in FIG. 11 is used.

According to the present invention, as depicted in FIG. 13, a method for fabrication of a MMIC with a thin film transistor of high carrier mobility and large breakdown electric field comprises the steps of: selecting a dielectric substrate (705) having a dielectric substrate thickness (705T), depositing a first dielectric layer (710) having a first dielectric layer thickness (710T, FIG. 13A); etching said first dielectric layer to form a transistor gate head portion cavity (715C) having a gate head portion cavity length (715L, FIG. 13B) and a first capacitor electrode cavity (716C) having a first capacitor electrode cavity length (716L); depositing a first metal layer (715M, FIG. 13C) having a first metal layer thickness (715MT) which is substantially larger than said first dielectric layer thickness (710T); performing a first chemical and mechanical polishing to create a first metal gate head portion (715, FIG. 13D) having a first metal gate head portion thickness (715T) and a first metal gate head portion length (715L) said first metal gate head portion is embedded in said first dielectric layer (710). Said first chemical and mechanical polishing also creates a first capacitor electrode (716) having a first capacitor electrode length (716L) and a first capacitor electrode thickness (716T), (716T) is substantially the same as said first metal gate head portion thickness (715T) and said first dielectric layer thickness (710T).

The fabrication method for MMICs further comprises the steps of depositing a second dielectric layer (718, FIG. 13E) with a second dielectric layer thickness (718T); etching selectively a portion of said second dielectric layer to form a first metal gate stem portion cavity (720C, FIG. 13F), having a first metal gate stem portion cavity length (720L); depositing a first metal gate stem portion layer (720M, FIG. 13G) having a first gate metal stem portion layer thickness (720MT), said first gate metal stem portion layer thickness is greater than said second dielectric layer thickness (718T); performing a second chemical and mechanical polishing to create a first metal gate stem portion (720, FIG. 13H) having a first metal gate stem portion thickness (720T) and a first metal gate stem portion length (720L). Said first metal gate stem portion (720) is embedded in said second dielectric layer (718) and is in direct electric contact with said first metal gate head portion (715). Said first metal gate stem portion thickness (720T) is substantially the same as said second dielectric layer thickness (718T).

The fabrication method for MMICs further comprises the steps of depositing a third dielectric layer (725, FIG. 13I) having a third dielectric layer thickness (725T); depositing and patterning a first thin film resistor layer (750, FIG. 13J) having a first thin film resistor layer thickness (750T); depositing and patterning a first semiconductor channel layer (730, FIG. 13K) having a first semiconductor channel layer thickness (730T); depositing and patterning a drain ledge layer (735D) and a source ledge layer (735S) having a ledge layer thickness (735T) and a ledge layer gap (735L), said drain ledge layer and said source ledge layer are in proximity to said first metal gate stem portion (720); depositing and patterning a drain (740D, FIG. 13L), a source (740S) having a drain/source thickness (740T) and a source drain gap (740L) and a second capacitor electrode (717) having a second capacitor electrode thickness same as (740T), said second capacitor electrode (717) overlaps at least a portion of said first capacitor electrode (716); depositing and patterning a first resistor contact (760A) and a second resistor contact (760B) with a resistor contact thickness (760T); depositing a fourth dielectric layer (745, FIG. 13M) having a fourth dielectric layer thickness (745T) for protection and passivation of said thin film transistor (700TR); depositing a resistor dielectric layer (765) having a resistor dielectric layer thickness (765T) for protection and passivation of said thin film resistor (700R); and finally depositing a back metal layer (770, FIG. 13N) having a back metal layer thickness (770T) on the back side of the dielectric substrate (705) to complete the fabrication processes of MMIC (700).

Figure 13A:
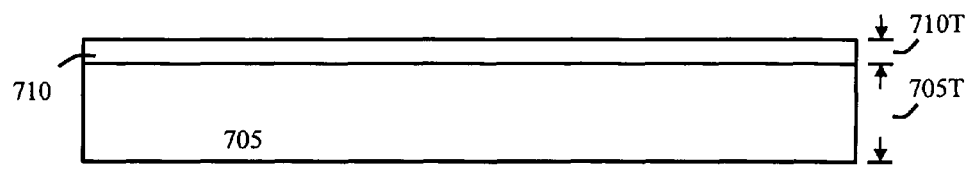
FIGS. 13A-13N show the main fabrication steps for a simplified MMIC 700 shown in FIG. 11.
Figure 13B:
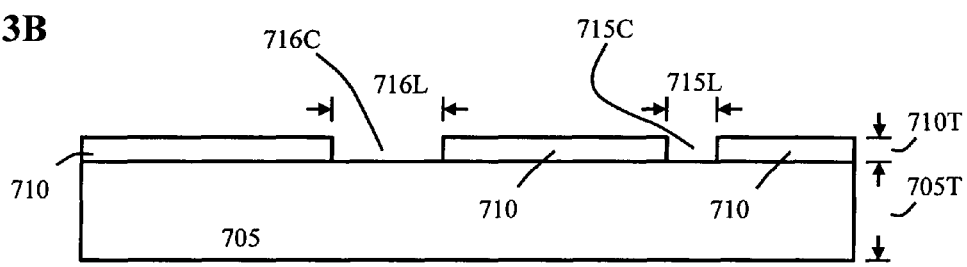
Figure 13C:
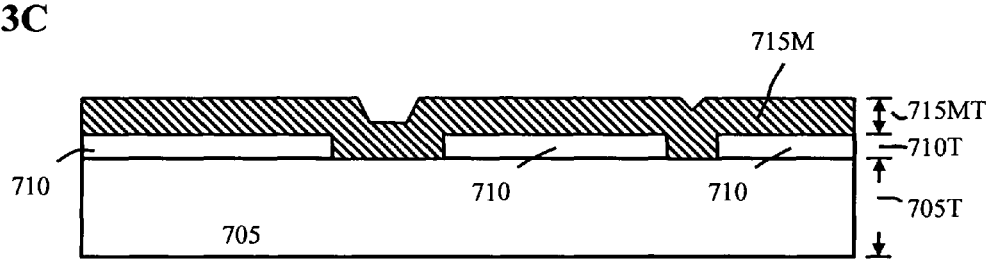
Figure 13D:
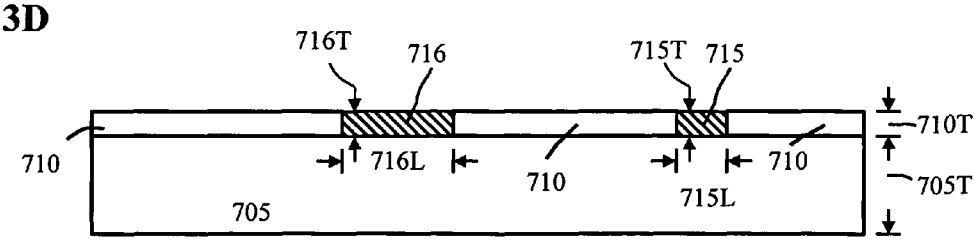
Figure 13E:
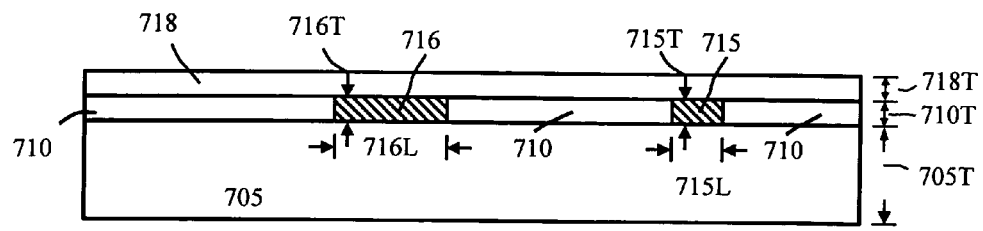
Figure 13F:
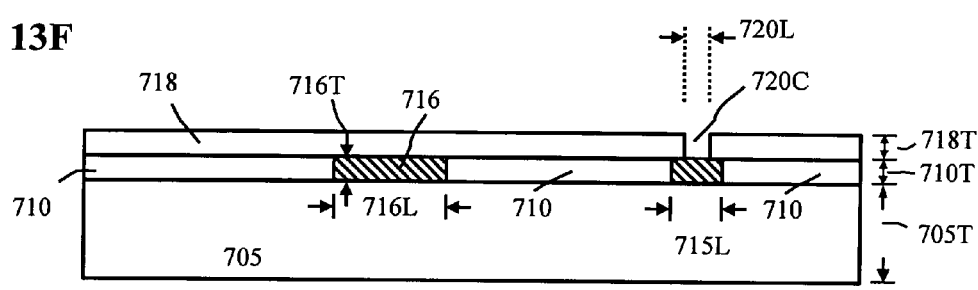
Figure 13G:
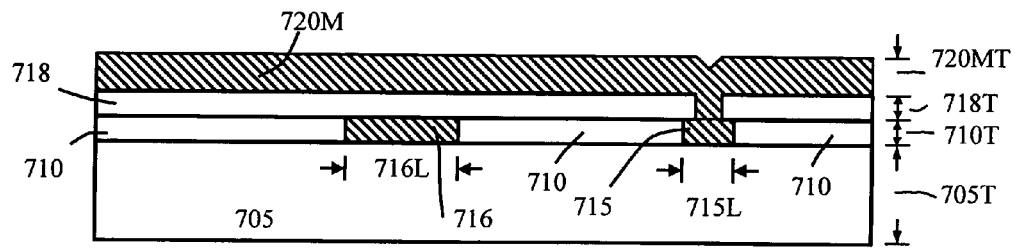
Figure 13H:
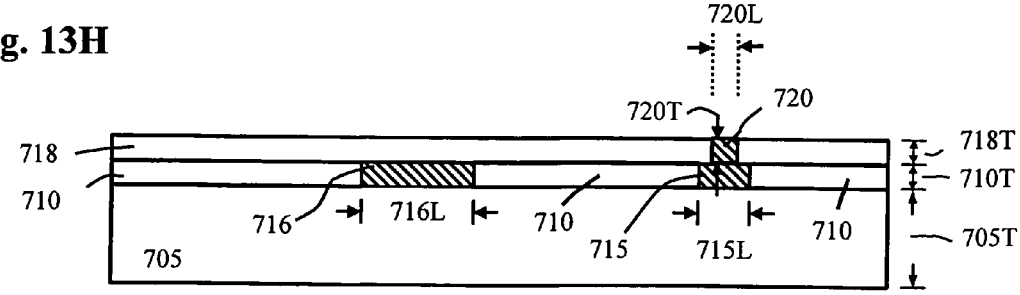
Figure 13I:
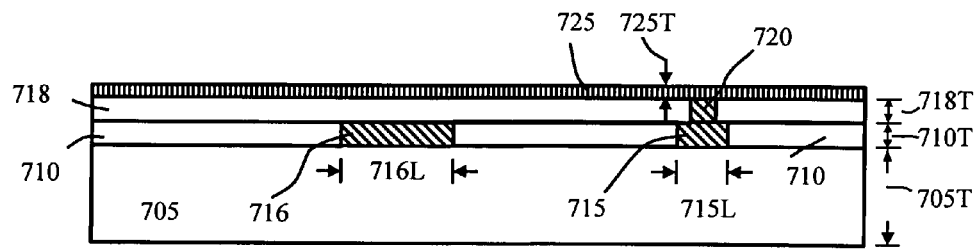
Figure 13J:
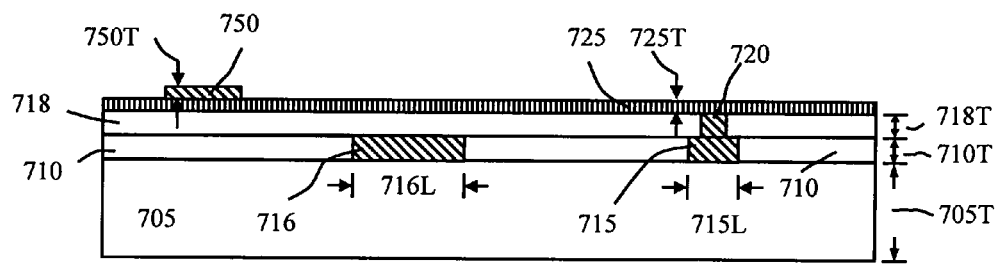
Figure 13K:
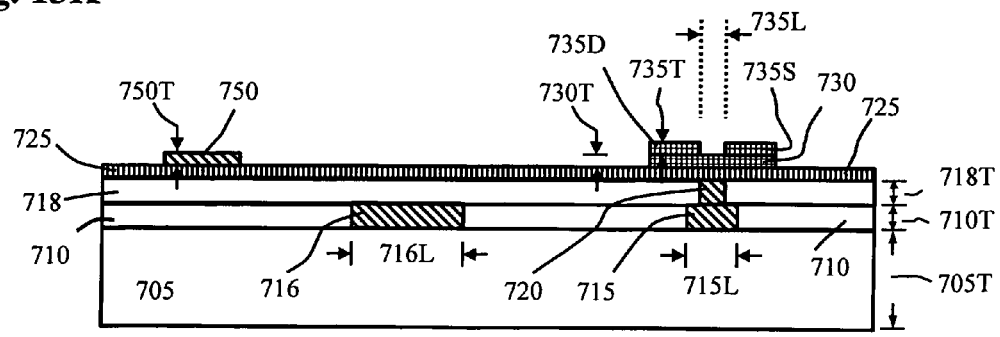
Figure 13L:
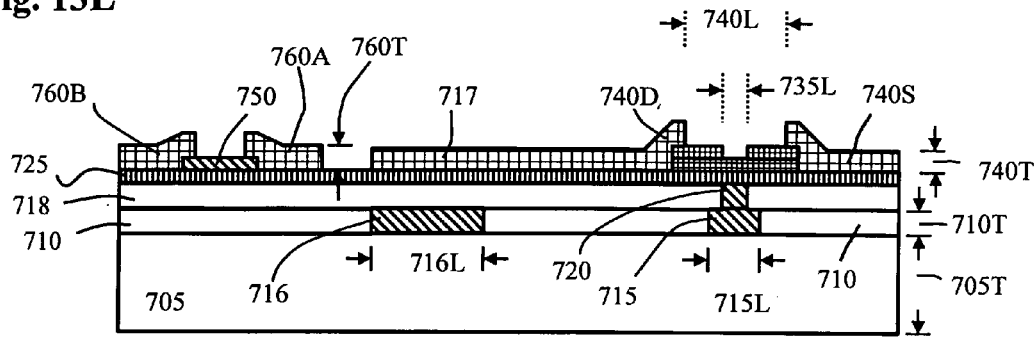
Figure 13M:
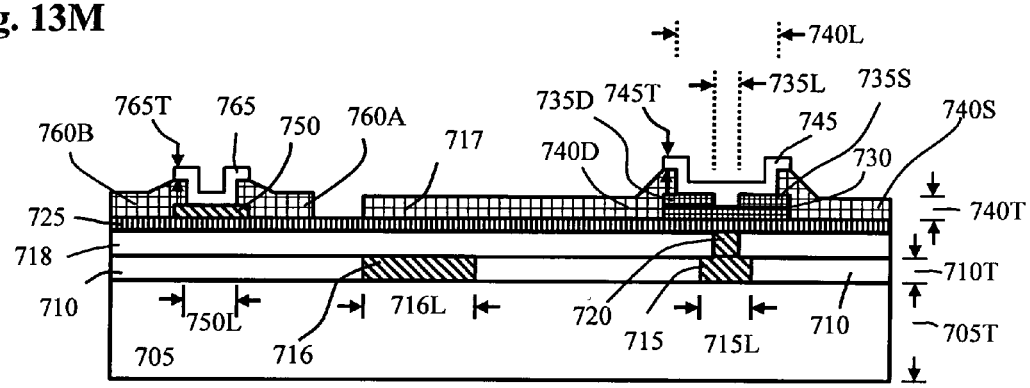
Figure 13N:
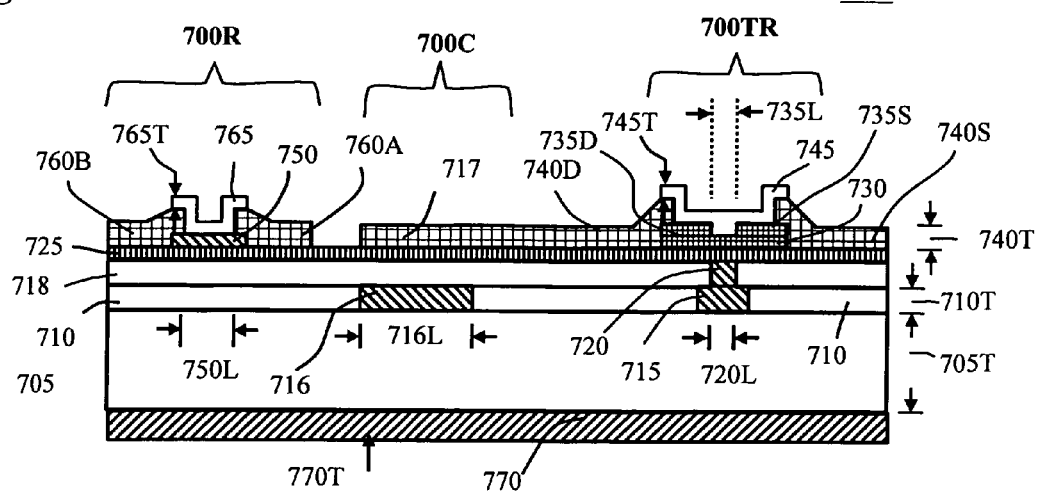

For MMIC (700) shown in FIG. 13N, the first and second resistor contacts (760A and 760B) may be deposited and formed at the same time as said source, drain and second capacitor electrode, therefore the resistor contact thickness (760T) is the same as (740T). Similarly, the resistor dielectric layer (765) may be deposited in the same fabrication step as said fourth dielectric layer (745). In such case, the resistor dielectric layer thickness (765T) is the same as the fourth dielectric layer thickness (745T). Although the fabrication steps described above are in certain sequence, order of some of the steps can be interchangeable. Since the third dielectric layer (725) in FIG. 13 also covers the second dielectric layer (718) between the first capacitor electrode (716) and the second capacitor electrode (717), capacitance of said capacitor (700C) is defined by overlapping area of the first capacitor electrode and second capacitor electrode, second dielectric layer thickness (718T), third dielectric layer thickness (725T) and dielectric constant of said second and third dielectric layers. The edges of the first resistor contact (760A) and second resistor contact (760B) defines a thin film resistor length (750L), sheet resistance of said thin film resistor layer (750) being regulated by controlling resistivity of said first thin film resistor and said first thin film resistor thickness.

Materials of the first semiconductor channel layer (730) is selected from a material group of metal oxide, metal oxide nitride, metal nitride with metal being selected from a material group of In, Zn, Sn, Ga and their mixtures. Material for the drain ledge layer (735D) and source ledge layer (735S) is selected from a group of semiconductors metal oxide, metal oxide nitride and metal nitride, where said metal is selected from a material group of In, Zn, Ga, Sn. Conductivity of the drain ledge layer and source ledge layer is controlled to be substantially high through adjusting stoichiometry or by impurity doping. Deposition of the metal oxide, metal oxinitride and metal nitride may be achieved by sputtering, reactive sputtering, ion sputtering, MOCVD and MBE. When properly selected and deposited, the breakdown electric field of the first semiconductor channel layer (730) can be several times of 0.4 MV/cm. The materials for the first dielectric layer, second dielectric layer, third dielectric layer, fourth dielectric layer and resistor dielectric layer may be selected from a material group of silicon oxide, silicon oxinitride, silicon nitride, hafnium oxide, aluminum oxide or their mixtures. The first thin film resistor layer (750) may be selected from material group tantalum oxide, nickel-chromium alloy. The dielectric substrate (705) is selected from a material group of alumina, silica glass and plastic.

In thin film transistor applications, it is understood that a structure with two gate fingers are often in order to increase the breakdown voltage and to reduce the leakage. To simplify the description, the thin film transistor in the present invention is described using a single gate finger structure. Therefore, it is understood that thin film transistors described in the present invention should not be limited to a single finger. A two finger structure or even more fingers may well be adopted in this invention.

What is claimed is:

1. A fabrication method for a MMIC with a thin film transistor of a planar semiconductor channel layer, a thin film capacitor and a thin film resistor where post fabrication substrate grinding and etching is not needed comprises:
   selecting a dielectric substrate;
   depositing a first dielectric layer having a first dielectric layer thickness;
   etching selectively portions of said first dielectric layer to form a first metal gate head portion cavity and a first capacitor electrode cavity;
   depositing a first metal layer having a first metal layer thickness substantially greater than said first dielectric layer thickness;
   performing a first chemical and mechanical polishing to create a first metal gate head portion and a first capacitor electrode, said first metal gate head portion and said first capacitor electrode are embedded in said first dielectric layer;
   depositing a second dielectric layer with a second dielectric layer thickness;
   etching selectively a portion of said second dielectric layer to form a first metal gate stem portion cavity;
   depositing a second metal layer having a second metal layer thickness substantially greater than said second dielectric layer thickness;
   performing a second chemical and mechanical polishing to create a first metal gate stem portion, said first metal gate stem portion is embedded in said second dielectric layer and is in direct electric contact with said first metal gate head portion;
   depositing a third dielectric layer having a third dielectric layer thickness;
   depositing and patterning a first thin film resistor layer having a first thin film resistor layer thickness;
   depositing and patterning a first semiconductor channel layer having a first semiconductor channel layer thickness;
   depositing and patterning a drain ledge layer and a source ledge layer having a ledge layer thickness and a ledge layer gap;
   depositing and patterning a drain, a source and a second capacitor electrode, said second capacitor electrode overlaps at least a portion of said first capacitor electrode;
   depositing and patterning a first resistor contact and a second resistor contact;
   depositing a fourth dielectric layer for protection and passivation of said thin film transistor;
   depositing a resistor dielectric layer for protection and passivation of said thin film resistor; and
   depositing a back metal layer on a back side of said dielectric substrate to complete the fabrication processes of a MMIC.

2. A fabrication method for a MMIC with a thin film transistor of a planar semiconductor channel layer, a thin film capacitor and a thin film resistor as defined in claim 1, wherein material of said first semiconductor channel layer is selected from a material group comprising: metal oxide, metal oxide nitride, metal nitride with metal being selected from a group of In, Zn, Sn, Ga and their alloys, deposition of said metal oxide, metal oxinitride and metal nitride may be achieved by sputtering, reactive sputtering, ion sputtering, MOCVD and MBE.

3. A fabrication method for a MMIC with a thin film transistor of a planar semiconductor channel layer, a thin film capacitor and a thin film resistor as defined in claim 1, wherein material of said drain ledge layer and source ledge layer being selected from a group of metal oxide, metal oxide nitride and metal nitride, wherein said metal is selected from a group of In, Zn, Ga, Sn and their alloys, conductivity of said drain ledge layer and source ledge layer is controlled to be substantially high through adjusting stoichiometry or by impurity doping.

4. A fabrication method for a MMIC with a thin film transistor of a planar semiconductor channel layer, a thin film capacitor and a thin film resistor as defined in claim 1, wherein said dielectric substrate is selected from a group comprising: alumina, silica glass and plastic.

5. A fabrication method for a MMIC with a thin film transistor of a planar semiconductor channel layer, a thin film capacitor and a thin film resistor as defined in claim 1, wherein materials of said first dielectric layer, second dielectric layer, third dielectric layer, fourth dielectric layer and resistor dielectric layer is selected from a group of silicon oxide, silicon oxinitride, silicon nitride, hafnium oxide, aluminum oxide or their mixtures.

6. A fabrication method for a MMIC with a thin film transistor of a planar semiconductor channel layer, a thin film capacitor and a thin film resistor as defined in claim 1, wherein said first thin film resistor layer is selected from a material group of tantalum oxide and nickel-chromium alloy.

7. A fabrication method for a MMIC with a thin film transistor of a planar semiconductor channel layer, a thin film capacitor and a thin film resistor as defined in claim 1, sheet resistance of said first thin film resistor layer being regulated by controlling resistivity of said first thin film resistor layer and said first thin film resistor layer thickness.

8. A fabrication method for a MMIC with a thin film transistor of a planar semiconductor channel layer, a thin film capacitor and a thin film resistor as defined in claim 1, capacitance of said thin film capacitor is defined by overlapping area of said first capacitor electrode and said second capacitor electrode, second dielectric layer thickness, third dielectric layer thickness and dielectric constant of said second and third dielectric layers.

* * * * *